United States Patent
Morishima

(10) Patent No.: US 10,651,430 B2
(45) Date of Patent: May 12, 2020

(54) ORGANIC ELECTRONIC ELEMENT MANUFACTURING METHOD AND ORGANIC ELECTRONIC ELEMENT

(71) Applicant: SUMITOMO CHEMICAL COMPANY, LIMITED, Tokyo (JP)

(72) Inventor: Shinichi Morishima, Tsukuba (JP)

(73) Assignee: SUMITOMO CHEMICAL COMPANY, LIMITED, Chuo-ku, Tokyo (JP)

( * ) Notice: Subject to any disclaimer, the term of this patent is extended or adjusted under 35 U.S.C. 154(b) by 0 days.

(21) Appl. No.: 15/766,487
(22) PCT Filed: Oct. 3, 2016
(86) PCT No.: PCT/JP2016/079310
§ 371 (c)(1),
(2) Date: Apr. 6, 2018
(87) PCT Pub. No.: WO2017/061380
PCT Pub. Date: Apr. 13, 2017

(65) Prior Publication Data
US 2018/0294444 A1   Oct. 11, 2018

(30) Foreign Application Priority Data
Oct. 8, 2015   (JP) .................................. 2015-200118

(51) Int. Cl.
H01L 51/56   (2006.01)
H05B 33/02   (2006.01)
(Continued)

(52) U.S. Cl.
CPC .......... *H01L 51/56* (2013.01); *H01L 51/0008* (2013.01); *H01L 51/0097* (2013.01);
(Continued)

(58) Field of Classification Search
CPC . H01L 51/56; H01L 51/5092; H01L 51/5012; H01L 51/5056; H01L 51/5072;
(Continued)

(56) References Cited

U.S. PATENT DOCUMENTS

2009/0267507 A1   10/2009   Takashima et al.
2015/0069349 A1*   3/2015   Hayashi ................ H01L 51/524
                                                                  257/40
2016/0218326 A1   7/2016   Fleissner et al.

FOREIGN PATENT DOCUMENTS

DE   102013110037 A1   3/2015
JP   2002-367774 A   12/2002
(Continued)

OTHER PUBLICATIONS

International Preliminary Report on Patentability with a translation of a Written Opinion dated Apr. 19, 2018, issued from the International Searching Authority in counterpart International Application No. PCT/JP2016/079310.
(Continued)

*Primary Examiner* — Mohammad M Hoque
(74) *Attorney, Agent, or Firm* — Sughrue Mion, PLLC

(57) ABSTRACT

An organic electronic element manufacturing method is a method of manufacturing an organic electronic element (1) having flexibility using a roll-to-roll process, including a first electrode forming step in which a first electrode (21) is pattern-formed onto a flexible substrate (10), a functional layer forming step in which a functional layer (23) containing an organic material is pattern-formed onto the first electrode (21), and a mask forming step in which a mask element (30) having flexibility is formed on the substrate (10) such that it has an opening on at least a portion of the functional layer (23) and at least a portion of the first electrode (21) with the functional layer (23) therebetween and covers edge portions (21*a* and 23*a*) on at least one side of the first electrode (21) and the functional layer (23).

6 Claims, 9 Drawing Sheets

(51) Int. Cl.
  *H05B 33/10* (2006.01)
  *H01L 51/00* (2006.01)
  *H01L 51/50* (2006.01)
  *H01L 51/52* (2006.01)
(52) U.S. Cl.
  CPC ...... *H01L 51/5012* (2013.01); *H01L 51/5056* (2013.01); *H01L 51/5072* (2013.01); *H01L 51/5092* (2013.01); *H01L 51/524* (2013.01); *H01L 51/5218* (2013.01); *H01L 51/5234* (2013.01); *H05B 33/02* (2013.01); *H05B 33/10* (2013.01); *H01L 2251/5338* (2013.01); *H01L 2251/5361* (2013.01)
(58) Field of Classification Search
  CPC ............ H01L 51/5218; H01L 51/0097; H01L 51/5234; H01L 51/524; H01L 51/0008; H01L 51/50; H05B 33/10; H05B 33/02
  USPC ........................................................ 438/99
  See application file for complete search history.

(56) References Cited

FOREIGN PATENT DOCUMENTS

| JP | 2006-294536 | A |   | 10/2006 |
| JP | 2012164581  | A | * | 8/2012  |
| JP | 2012-182005 | A |   | 9/2012  |
| JP | 2014-197474 | A |   | 10/2014 |
| JP | 2014-216191 | A |   | 11/2014 |
| WO | 2007/034647 | A1 |  | 3/2007  |
| WO | 2011/021622 | A1 |  | 2/2011  |
| WO | 2012/108217 | A1 |  | 8/2012  |

OTHER PUBLICATIONS

International Search Report dated Dec. 27, 2016 in counterpart international application No. PCT/JP2016/079310.
Notice of Reasons for Rejection dated Jun. 4, 2019 from the Japanese Patent Office in application No. 2015-200118.
Communication dated Mar. 12, 2019 from the China National Intellectual Property Administration in counterpart Application No. 201680056935.9.
Communication dated Jun. 4, 2019, from the European Patent Office in application No. 16853534.2.
Communication dated Nov. 8, 2019, from the China National Intellectual Property Administration in counterpart Application No. 201680056935.9.
Office Communication dated Sep. 3, 2019 in corresponding Japanese Patent Application No. P2015-200118 with translation.

* cited by examiner

ORGANIC ELECTRONIC ELEMENT MANUFACTURING METHOD AND ORGANIC ELECTRONIC ELEMENT

CROSS REFERENCE TO RELATED APPLICATIONS

This application is a National Stage of International Application No. PCT/JP2016/079310 filed Oct. 3, 2016, claiming priority based on Japanese Patent Application No. 2015-200118 filed Oct. 8, 2015, the disclosures of which are incorporated herein by reference.

TECHNICAL FIELD

The present invention relates to a method of manufacturing an organic electronic element having flexibility such as an organic EL element, an organic solar cell, and an organic transistor, and an organic electronic element having flexibility.

BACKGROUND ART

Organic electronic elements such as an organic electro luminescence (EL) element, an organic solar cell, and an organic transistor are known. This type of organic electronic element includes various functional layers such as a light emitting layer, a hole injection layer, a hole transport layer, an electron transport layer, an electron injection layer, an active layer, a semiconductor layer, and an insulating layer which contain an organic material.

This type of organic electronic element may be formed on a film-like substrate (substrate having flexibility, flexible substrate) to form a film shape. As a method of manufacturing a film-like organic electronic element, a method of forming various layers using a roll-to-roll process is known. In Patent Literature 1, an organic EL element manufacturing method is disclosed as a method of manufacturing this type of organic electronic element.

In the organic EL element manufacturing method disclosed in Patent Literature 1, when the film-like substrate is wound after a step of forming various layers, a flexible polymer film with a predetermined width is applied to and wound as a winding auxiliary member around both ends in the width direction. Thus, during winding, it is possible to prevent a film surface of the organic EL element from rubbing against the substrate and a film surface of the organic EL element from being scratched.

In addition, in the method of manufacturing this type of organic electronic element, as a method of forming an electrode, a vapor deposition method, a sputtering method, and a CVD method are generally used. In the method of forming this type of electrode, a shadow mask is disposed in a vapor deposition device, a sputtering device, or a CVD device, and a film-like substrate and the mask are aligned to form a film.

CITATION LIST

Patent Literature

[Patent Literature 1] Japanese Patent Application Laid-Open Publication No. 2006-294536

SUMMARY OF INVENTION

Technical Problem

Incidentally, in the organic EL element manufacturing method disclosed in Patent Literature 1, when the width of the film-like substrate becomes wider, it may not be possible to prevent a film surface (surface on which an organic layer is formed) on which the organic EL element of the film-like substrate is formed and a back surface of the substrate from coming in contact with each other in the central portion in the width direction due to sagging. Further, it may not be possible to prevent a film surface (surface on which an organic layer is formed) and a roller in a manufacturing device using a roll-to-roll process from coming in contact with each other in the central portion in the width direction. When this type of contact occurs, the organic EL layer may be damaged. A film transport mechanism may be complicated in order to avoid such damage and the productivity may decrease.

In addition, in a continuous step using a roll-to-roll process, in an electrode forming step (in particular, a second electrode forming step), the continuous productivity may decrease due to setting of an electrode forming mask and the substrate.

Therefore, an object of an aspect of the present invention is to provide a method of manufacturing an organic electronic element through which it is possible to achieve both protection of a film surface and improvement in continuous productivity in an organic electronic element manufacturing method using a roll-to-roll process and an organic electronic element.

Solution to Problem

An organic electronic element manufacturing method according to an aspect of the present invention is a method of manufacturing an organic electronic element having flexibility using a roll-to-roll process. The method includes a first electrode forming step in which a first electrode is pattern-formed onto a flexible substrate; a functional layer forming step in which a functional layer containing an organic material is pattern-formed onto the first electrode; and a mask forming step in which a mask element having flexibility is formed on the substrate such that it has an opening on at least a portion of the functional layer and at least a portion of the first electrode with the functional layer therebetween and covers edge portions on at least one side of the first electrode and the functional layer.

According to the method of manufacturing an organic electronic element according to the aspect of the present invention, when the substrate is first wound on a roller after the first electrode and the functional layer are formed, the mask element having flexibility can prevent a film surface of the functional layer from coming in contact with a back surface of the substrate and additionally prevent a film surface of the functional layer from coming in direct contact with the roller. As a result, it is possible to prevent the film surface of the functional layer from being physically or chemically damaged (protection of the film surface).

In addition, according to the method of manufacturing an organic electronic element according to the aspect of the present invention, the mask element can be used as a mask for forming a second electrode, and it is not necessary to set a shadow mask for forming the second electrode as in the related art. Therefore, it is possible to improve continuous productivity (improvement in continuous productivity).

Here, since the mask element covers edge portions on at least one side of the first electrode and the functional layer, when the mask element is used as a mask for forming the second electrode, it is possible to prevent the first electrode and the second electrode from coming in contact with each other and it is possible to form a connecting portion for lead-out wiring on the edge portion on at least one side of the first electrode.

In the mask forming step, the mask element having flexibility may be formed on the substrate to surround four sides of the first electrode and the functional layer in an opening region.

Accordingly, when a plurality of organic electronic elements are two-dimensionally arranged on the substrate, it is possible to form a grid-like mask element that crosses an elongated substrate in the longitudinal direction and the width direction. Therefore, when the substrate is first wound on a roller after the first electrode and the functional layer are formed, even if the width of the elongated substrate becomes wider, the grid-like mask element can prevent the occurrence of sagging and it is possible to prevent a film surface of the functional layer from coming in contact with a back surface of the substrate also in the central portion in the width direction. In addition, it is possible to prevent a film surface of the functional layer from coming in direct contact with a roller. As a result, it is possible to prevent a film surface of the functional layer from being physically or chemically damaged (protection of the film surface).

In addition, the mask forming step may include a step in which a lamination film in which a first removable release sheet, a mask film having flexibility, a second removable release sheet, and a carrier film are laminated in that order, and the first removable release sheet and the mask film are processed into the mask element having the opening is produced; a step in which the lamination film is laminated on the substrate such that the mask element covers edge portions on at least one side of the first electrode and the functional layer; and a step in which the second removable release sheet and the carrier film in the lamination film are separated from the mask element.

For example, when an opening is formed in the mask film, if there is no carrier film, since tension is applied to the mask film in the longitudinal direction in roll-to-roll, the mask film becomes bent. However, accordingly, since the carrier film is backed, the tension is dispersed in the carrier film and additionally the carrier film is also present in an opening portion of the mask film. Thus, yawing of the mask film due to the opening is significantly reduced. In addition, since processing into the mask element is performed before the lamination film is laminated on the substrate, the substrate is not damaged by processing into the mask element. In addition, direct contact of the first electrode or the functional layer with the mask element, the carrier film, and the release sheet is prevented according to the opening processed into the mask element. Therefore, it is possible to prevent the occurrence of defects caused by adherence of contamination components, rubbing, and pushing and indentation of foreign substances due to contact.

In addition, the mask forming step may include a step in which a removable release sheet and a mask film having flexibility are laminated on the substrate such that the first electrode and the functional layer are covered; and a step in which the removable release sheet and the mask film are processed into the mask element having the opening. Specifically, the mask element is directly laminated on a light emitting region including a first electrode and a functional layer, and is cut into an arbitrary shape that forms a second electrode including the light emitting region, and this portion is separated therefrom and removed.

Accordingly, since a carrier film is not used, economic efficiency is excellent, and the mask element is laminated on the light emitting region. Therefore, when the mask element is processed and the substrate is transported, it is possible to prevent foreign substances from adhering to the light emitting region. In addition, when separation and removal are performed, foreign substances that are adhered before lamination can be removed all at once and a failure rate of a device can be reduced.

In addition, the method of manufacturing an organic electronic element may further include a second electrode forming step in which a second electrode is formed on the functional layer using the mask element.

In addition, the method of manufacturing an organic electronic element may further include a sealing film forming step in which a sealing film is formed on the second electrode using the mask element. Accordingly, the mask element can be used as a mask for forming a sealing film and it is not necessary to set a shadow mask for forming the sealing film as in the related art. Therefore, it is possible to improve continuous productivity.

In addition, the method of manufacturing an organic electronic element may further include a mask separating step in which the mask element is separated from the substrate.

A method of manufacturing an organic electronic element according to another aspect of the present invention is a method of manufacturing an organic electronic element having flexibility using a roll-to-roll process. The method includes a first electrode forming step in which a first electrode is pattern-formed onto a flexible substrate; and a mask forming step in which a mask element having flexibility is formed on the substrate such that it has an opening on at least a portion of the first electrode and covers an edge portion on at least one side of the first electrode. In the method of manufacturing an organic electronic element according to another aspect, after the mask forming step, a functional layer forming step in which a functional layer containing an organic material is pattern-formed on the first electrode is performed.

Also in the method of manufacturing an organic electronic element according to another aspect of the present invention, when the substrate is first wound on a roller after the first electrode and the functional layer are formed, the mask element having flexibility can prevent a film surface of the functional layer from coming in contact with a back surface of the substrate and additionally prevent a film surface of the functional layer from coming in direct contact with the roller. As a result, it is possible to prevent the film surface of the functional layer from being physically or chemically damaged (protection of the film surface).

In addition, also in the method of manufacturing an organic electronic element according to another aspect of the present invention, the mask element can be used as a mask for forming a second electrode, and it is not necessary to set a shadow mask for forming the second electrode as in the related art. Therefore, it is possible to improve continuous productivity (improvement in continuous productivity).

Here, since the mask element covers an edge portion on at least one side of the first electrode, when the mask element is used as a mask for forming a second electrode, it is possible to prevent the first electrode and the second electrode from coming in contact with each other and it is possible to form a connecting portion for lead-out wiring on the edge portion on at least one side of the first electrode.

In the mask forming step, the mask element having flexibility may be formed on the substrate to surround four sides of the first electrode in an opening region.

Accordingly, when a plurality of organic electronic elements are two-dimensionally arranged on the substrate, it is possible to form a grid-like mask element that intersects the longitudinal direction and the width direction of an elongated substrate. Therefore, when the substrate is first wound on a roller after the first electrode and the functional layer are formed, even if the width of the elongated substrate becomes wider, the grid-like mask element can prevent the occurrence of sagging and it is possible to prevent a film surface of the functional layer from coming in contact with a back surface of the substrate also in the central portion in the width direction. In addition, it is possible to prevent a film surface of the functional layer from coming in direct contact with a roller. As a result, it is possible to prevent a film surface of the functional layer from being physically or chemically damaged (protection of the film surface).

In addition, the mask forming step may include a step in which a lamination film in which a first removable release sheet, a mask film having flexibility, a second removable release sheet, and a carrier film are laminated in that order, and the first removable release sheet and the mask film are processed into the mask element having the opening is produced, a step in which the lamination film is laminated on the substrate such that the mask element covers an edge portion on at least one side of the first electrode; and a step in which the second removable release sheet and the carrier film in the lamination film are separated from the mask element.

Accordingly, similarly to the above, since the carrier film is backed, the tension is dispersed in the carrier film and additionally the carrier film is also present in an opening portion of the mask film. Thus, yawing of the mask film due to the opening is significantly reduced. In addition, since processing into the mask element is performed before the lamination film is laminated on the substrate, the substrate is not damaged by processing into the mask element. In addition, direct contact of the first electrode with the mask element, the carrier film, and the release sheet is prevented according to the opening processed into the mask element. Therefore, it is possible to prevent the occurrence of defects caused by adherence of contamination components, rubbing, and pushing and indentation of foreign substances due to contact.

In addition, the mask forming step may include a step in which a removable release sheet and a mask film having flexibility are laminated in that order on the substrate such that the first electrode is covered; and a step in which the removable release sheet and the mask film are processed into the mask element having the opening. Specifically, the mask element is directly laminated on a light emitting region in the first electrode and is cut into an arbitrary shape that forms a second electrode including the light emitting region, and this portion is separated therefrom and removed.

Accordingly, similarly to the above, since the carrier film is not used, economic efficiency is excellent, and the mask element is laminated on the light emitting region. Therefore, when the mask element is processed and the substrate is transported, it is possible to prevent foreign substances from adhering to the light emitting region. In addition, when separation and removal are performed, foreign substances that are adhered before lamination can be removed all at once and a failure rate of a device can be reduced.

In addition, the method of manufacturing an organic electronic element according to another aspect may further include a functional layer forming step in which a functional layer containing an organic material is pattern-formed onto the first electrode after the mask forming step; and a second electrode forming step in which a second electrode is formed on the functional layer using the mask element.

In addition, the method of manufacturing an organic electronic element according to another aspect may further include a sealing film forming step in which a sealing film is formed on the second electrode using the mask element. Accordingly, the mask element can be used as a mask for forming a sealing film and it is not necessary to set a shadow mask for forming the sealing film as in the related art. Therefore, it is possible to improve continuous productivity.

In addition, the method of manufacturing an organic electronic element according to another aspect may further include a mask separating step in which the mask element is separated from the substrate.

An organic electronic element according to an aspect of the present invention can be manufactured by the method of manufacturing an organic electronic element or a method of manufacturing an organic electronic element according to another aspect.

Advantageous Effects of Invention

According to an aspect of the present invention, in an organic electronic element manufacturing method using a roll-to-roll process, it is possible to achieve both protection of a film surface and improvement in continuous productivity.

DESCRIPTION OF EMBODIMENTS

Figure 1A:
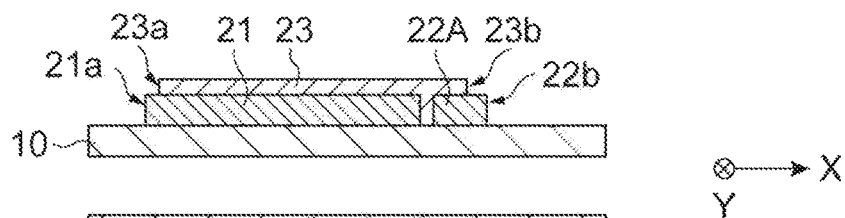
FIG. 1(A), FIG. 1(B), FIG. 1(C), FIG. 1(D), FIG. 1(E), FIG. 1(F) and FIG. 1(G) are diagrams (cross-sectional views) illustrating a method of manufacturing an organic EL element (organic electronic element) according to a first embodiment.

Embodiments will be described below in detail with reference to the drawings. Here, the same or corresponding components in the drawings are denoted with the same reference numerals.

First Embodiment

Figure 1B:
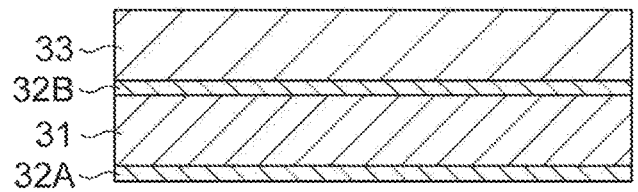
Figure 1C:
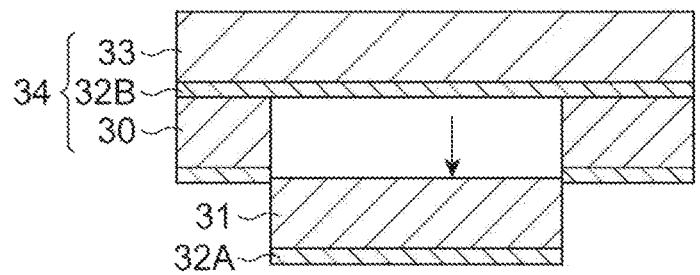
Figure 1D:
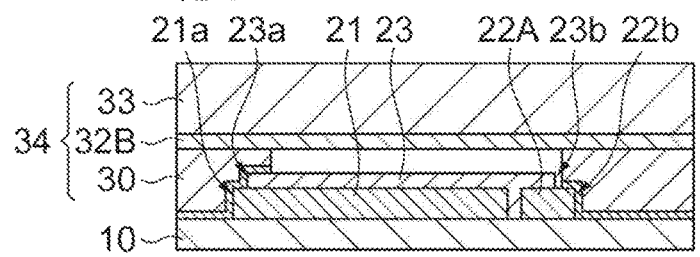
Figure 1E:
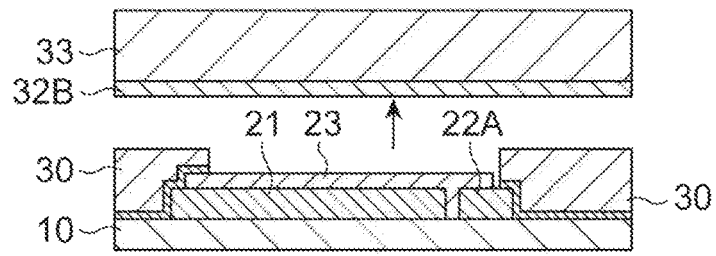
Figure 2:
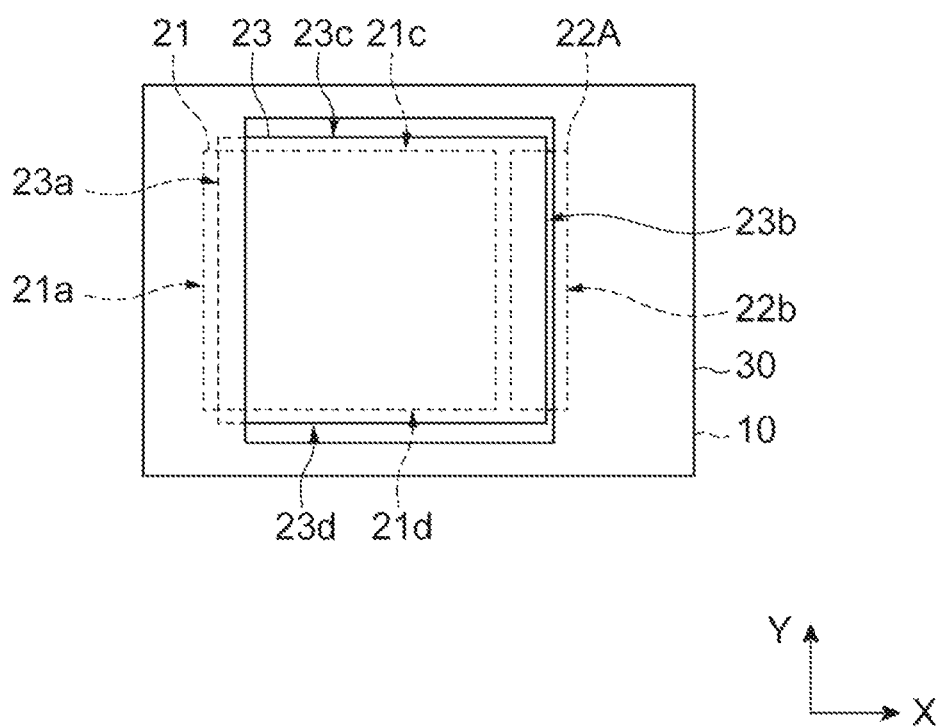
FIG. 2 is a illustrating an intermediate product for the organic EL element after a mask forming step illustrated in FIG. 1(E) when viewed from above.
Figure 3:
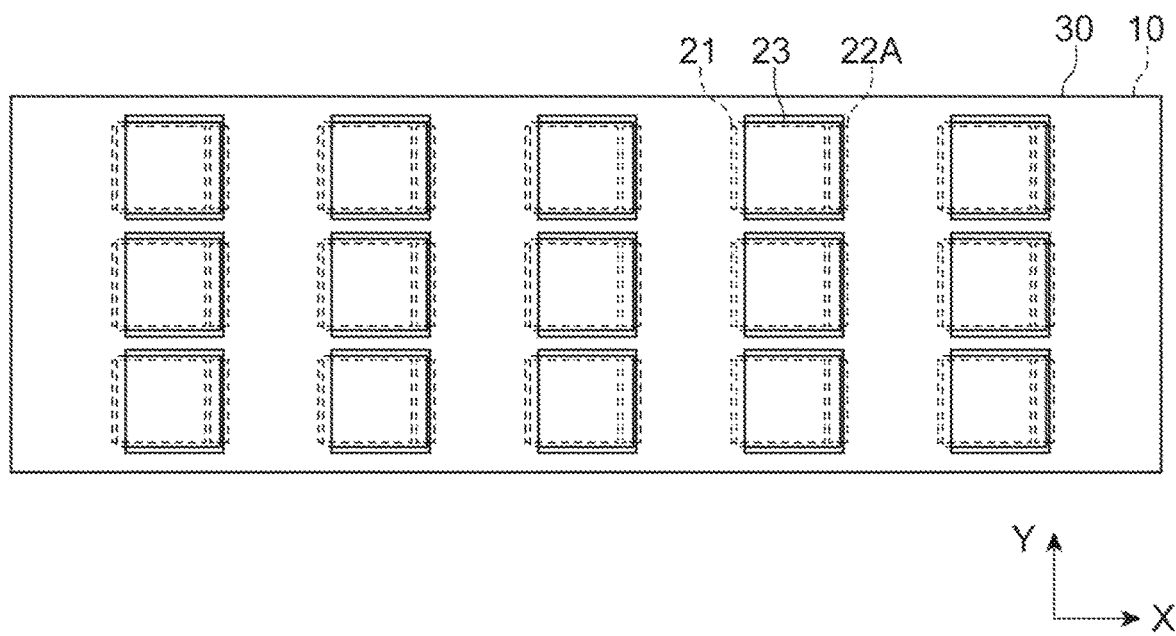
FIG. 3 is a diagram illustrating an elongated substrate (roll substrate) in which a plurality of intermediate products for the organic EL element after the mask forming step illustrated in FIG. 1(E) are two-dimensionally arranged when viewed from above.

FIGS. 1(A)-1(G) show diagrams (cross-sectional views) illustrating a method of manufacturing an organic EL element (organic electronic element) according to a first embodiment. FIG. 2 is a diagram illustrating the organic EL element illustrated in FIG. 1(E) when viewed from above. In addition, FIG. 3 is a diagram illustrating an elongated substrate (roll substrate) in which a plurality of organic EL elements illustrated in FIG. 1(E) are two-dimensionally arranged when viewed from above. In an organic EL element 1 in this example, a substrate 10 is set as a light emitting surface.

First, using a continuous transport method such as a roll-to-roll process, according to a vapor deposition method, a sputtering method, an ion plating method, a plating method, a transfer method, or the like, as illustrated in FIG. 1(A), FIG. 2, and FIG. 3, on the film-like substrate (substrate having flexibility, flexible substrate) 10, a positive electrode layer (first electrode layer) 21 for an organic EL portion 20 is pattern-formed. In addition, on the film-like substrate 10, a lead-out electrode layer 22A to be bonded to a negative electrode layer (second electrode layer) to be described below may be pattern-formed. Here, the positive electrode layer 21 and the lead-out electrode layer 22A may be electrically insulated, may be spatially separated in a longitudinal direction X of the substrate 10, or may be isolated with an insulating layer therebetween (first electrode forming step). A width direction of the substrate 10 will be set below as Y.

For the film-like substrate 10, a material having optical transparency such as PEN (polyethylene naphthalate) and PET (polyethylene terephthalate) may be used. For the positive electrode layer 21 and the lead-out electrode layer 22A, in particular, for a light emitting area of the positive electrode layer 21, for example, an electrode exhibiting optical transparency, more specifically, a conductive metal oxide thin film made of a relatively transparent material such as ITO (Indium Tin Oxide) and IZO (Indium Zinc Oxide) may be used. In addition, for the light emitting area of the positive electrode layer 21, a mesh electrode in which a metal is formed into a mesh shape can be used. A region other than the light emitting area of the positive electrode layer 21 and the lead-out electrode layer 22A may be made of the same material as the light emitting area of the positive electrode layer 21, or made of different materials, or may be opaque.

Next, using a roll-to-roll process, according to a coating method (for example, an ink jet printing method, a slit coating method, a spray method, or a screen printing method), a light emitting layer 23 for the organic EL portion 20 is pattern-formed on the positive electrode layer 21 or on the positive electrode layer 21 and the lead-out electrode layer 22A. Here, between the light emitting layer 23 and the positive electrode layer 21, functional layers such as a hole injection layer, a hole transport layer, and an electron blocking layer may be provided. In addition, between the light emitting layer 23 and the negative electrode layer 22 to be described below, functional layers such as an electron injection layer, an electron transport layer, and a hole blocking layer may be provided. In addition, between the positive electrode layer 21 and the negative electrode layer 22, an insulating layer having a higher electrical resistance than an electrical resistance in a lamination direction of a region in which the light emitting layer of the light emitting region and the functional layer are laminated may be provided in a region other than the light emitting region.

An edge portion 23a on one side in the longitudinal direction X of the light emitting layer 23 or the functional layer is formed to be shorter than an edge portion 21a such that the edge portion 21a on one side in the longitudinal direction X of the positive electrode layer 21 is exposed to obtain a lead-out wiring connecting portion. An edge portion 23b on the other side in the longitudinal direction X of the light emitting layer 23 or the functional layer is formed to be shorter than an edge portion 22b such that the edge portion 22b on the other side in the longitudinal direction X of the lead-out electrode layer 22A is exposed to obtain a lead-out wiring connecting portion. On the other hand, an edge portion 23c on one side in the width direction Y of the light emitting layer 23 or the functional layer is formed to be longer than an edge portion 21c such that the edge portion 21c on one side in the width direction Y of the positive electrode layer 21 is covered. The edge portion 23d on the other side in the width direction Y of the light emitting layer 23 is formed to be longer than an edge portion 21d such that the edge portion 21d on the other side in the width direction Y of the positive electrode layer 21 is covered. Here, the light emitting layer 23 may be deposited between the positive electrode layer 21 and the lead-out electrode layer 22A (functional layer forming step).

Figure 8:
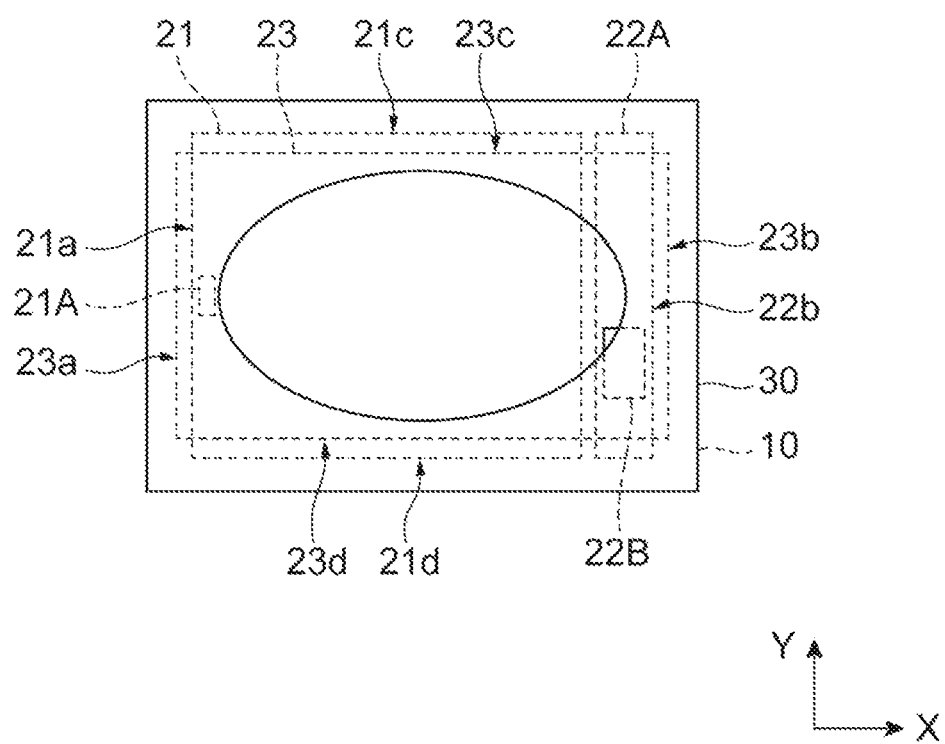
FIG. 8 is a diagram illustrating the intermediate product corresponding to FIG. 2, which is an intermediate product for the organic EL element according to the modified example, when viewed from above.

Here, as illustrated in FIG. 8, the light emitting layer 23 or the functional layer may be formed such that at least a portion 21A of the positive electrode layer 21 on the side of the edge portion 21a on one side in the longitudinal direction X of the positive electrode layer 21 is exposed to obtain a lead-out wiring connecting portion and at least the portion 21A on the side of the edge portion 21a of the positive electrode layer 21 is exposed. In addition, the light emitting layer 23 or the functional layer may be formed such that at least a portion 22B of the lead-out electrode layer 22A on the side of the edge portion 22b on the other side in the longitudinal direction X of the lead-out electrode layer 22A is exposed to obtain a lead-out wiring connecting portion and at least a portion on the side of the edge portion 22b of the lead-out electrode layer 22A is exposed.

The light emitting layer 23 contains various known organic EL materials such as low-molecular-weight type and high-molecular-weight type materials.

Next, using a roll-to-roll process, as illustrated in FIG. 1(B) to FIG. 1(E), FIG. 2 and FIG. 3, a mask element with an opening 30 is formed on the substrate 10 to surround four sides of the positive electrode layer 21 and the light emitting layer 23 or the functional layer in an opening region. In other words, the mask element with an opening 30 is a grid-like mask element that crosses the substrate 10 in the longitudinal direction X and the width direction Y. The mask element 30 is formed to cover the edge portions 21a and 23a in the positive electrode layer 21 and the light emitting layer 23 or the functional layer. In addition, the mask element 30 is formed to surround the edge portion 23b in the light emitting layer 23 or the functional layer.

In addition, the opening of the mask element 30 may have an arbitrary shape, for example, a circular shape or an elliptical shape as illustrated in FIG. 8. When the opening having an arbitrary shape is used, since the negative electrode layer 22 to be described below is formed into the shape of the opening, it is possible to obtain an arbitrary shape according to the shape of the opening, that is, it is possible to obtain a light emitting region having an arbitrary light emission pattern.

In addition, as illustrated in FIG. 8, on the side of the lead-out electrode layer 22A, the mask element 30 may be formed such that the opening overlaps the portion (lead-out wiring connecting portion) 22B from which the lead-out electrode layer 22A is exposed, and thus the lead-out electrode layer 22A and the negative electrode layer 22 can be electrically connected. In addition, as illustrated in FIG. 8, on the side of the edge portion 21a of the positive electrode layer 21, the mask element 30 may be formed such that the opening does not overlap the portion (lead-out wiring connecting portion) 21A from which the positive electrode layer 21 is exposed.

Figure 9:
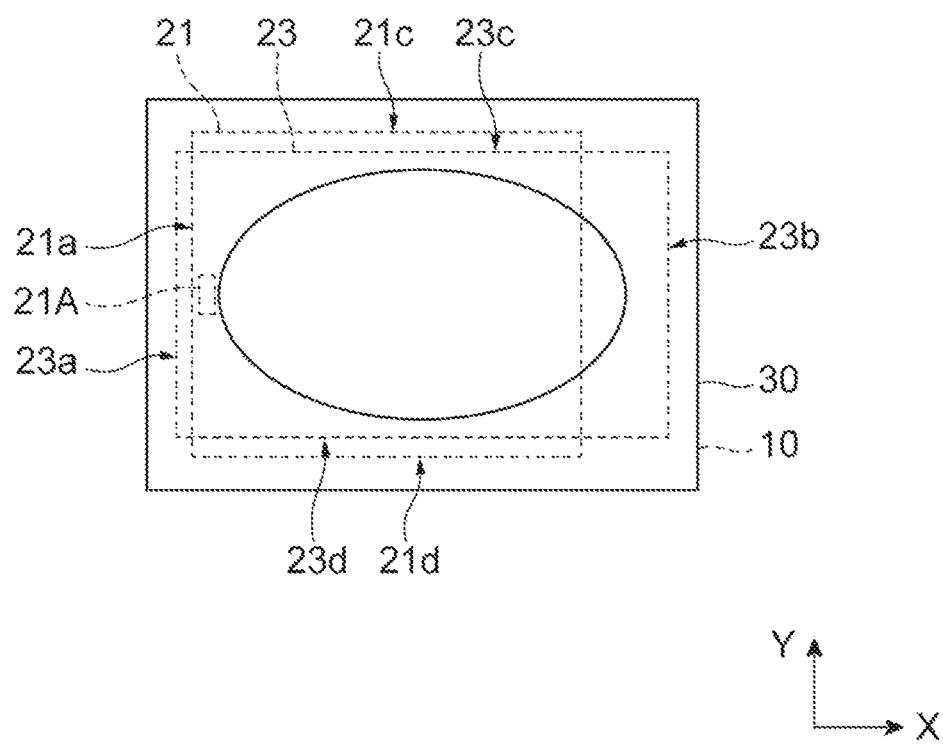
FIG. 9 is a diagram illustrating the intermediate product corresponding to FIG. 2, which is an intermediate product for the organic EL element according to the modified example, when viewed from above.

In addition, as illustrated in FIG. 9, the lead-out electrode layer 22A of the negative electrode layer 22 may be omitted. In addition, as illustrated in FIGS. 1(A)-1(G), FIG. 8 and FIG. 9, the opening of the mask element 30 may not overlap an exposed portion of the positive electrode layer 21 or the opening of the mask element 30 may overlap an exposed portion of the positive electrode layer 21. In this case, an insulating layer may be provided between the positive electrode layer 21 and the negative electrode layer 22.

In this manner, the mask element 30 may be formed on the substrate 10 such that it has an opening on at least a portion of the light emitting layer 23 or the functional layer and on at least a portion of the positive electrode layer 21 with the light emitting layer 23 or the functional layer therebetween and covers the edge portions 21a and 23a on at least one side of the positive electrode layer 21 and the light emitting layer 23 or the functional layer.

Specifically, first, as illustrated in FIG. 1(B) and FIG. 1(C), a first removable release sheet 32A, a mask film 31 having flexibility, a second removable release sheet 32B, and a carrier film 33 are laminated in that order and the release sheet 32A and the mask film 31 are processed into the mask element 30 to produce a lamination film 34. Specifically, the opening region is cut out from the release sheet 32A and the mask film 31 and thus the mask element 30 is produced.

Next, as illustrated in FIG. 1(D), the lamination film 34 is laminated on the substrate 10 such that the mask element 30 covers the edge portions 21a and 23a of the positive electrode layer 21 and the light emitting layer 23 or the functional layer and the mask element 30 surrounds the edge portion 23b in the light emitting layer 23 or the functional layer.

Next, as illustrated in FIG. 1(E), the removable release sheet 32B and the carrier film 33 in the lamination film 34 are separated from the mask element 30 (mask forming step).

As a material of the mask film 31, that is, a material of the mask element 30, a material having the same coefficient of linear thermal expansion as the substrate can be selected in order to prevent the occurrence of separation and wrinkles depending on a temperature during a second electrode forming process. Specifically, examples of a material of the mask element 30 include PEN and PET. In addition, for the mask element 30, a plastic film having a glass transition temperature that is higher than the temperature during the second electrode forming process can be used. Specifically, examples of a material of the mask element 30 include a polyimide and a fluorine resin. In addition, for the mask element 30, a metal foil, a composite member in which a metal, particularly, Al or Cu, and a plastic film are laminated or a glass cloth can be used. For the removable release sheets 32A and 32B, an acrylic type, silicon type, or polyolefin material may be used. Examples of a material of the carrier film 33 include PET, PC (polycarbonate), PS (polystyrene), and PE (polyethylene).

Figure 1F:
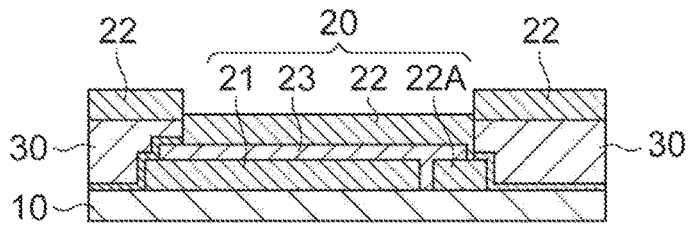

Next, using a roll-to-roll process, according to a vapor deposition method, a sputtering method, an ion plating method, a plating method, a transfer method, or the like, as illustrated in FIG. 1(F), the negative electrode layer 22 for the organic EL portion 20 is formed on the light emitting layer 23 or the functional layer. In this case, the mask element 30 is used as a mask (second electrode forming step). As the negative electrode layer 22, for example, an electrode exhibiting light reflectivity, more specifically, a conductive metal thin film made of a metal material may be used. In particular, in consideration of light reflectivity and conductivity, as the negative electrode layer 22, Al, an Al alloy (such as AlNd), Ag, and an Ag alloy (such as AgPaCu) are preferable.

Figure 1G:
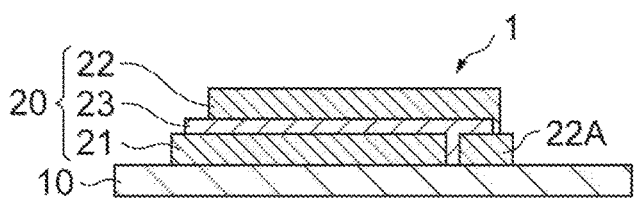

Next, using a roll-to-roll process, as illustrated in FIG. 1(G), the mask element 30 is separated from the substrate 10 (mask separating step). Here, after a sealing film is formed on the negative electrode layer 22 using the mask element 30 (sealing film forming step), the mask element 30 may be separated therefrom. As a material of the sealing film, a silicon oxide, a silicon oxynitride and a silicon nitride (may contain carbon in a composition) such as SiOx, SiOxNy, and SiNx, and an aluminum oxide such as AlxOy may be used for an inorganic film having a moisture permeability barrier property. Examples of a method of forming a sealing film include a CVD method, a sputtering method, a vapor deposition method, and a method of forming a film by coating a precursor and applying light or heat energy. In addition, in order to perform flattening or to prevent penetration of pinholes into the inorganic film, an organic layer made of an acrylic resin or the like may be formed. In addition, the organic layer may contain a metal oxide, a metal complex, or a getter material having a moisture capture function such as a zeolite.

Figure 4A:
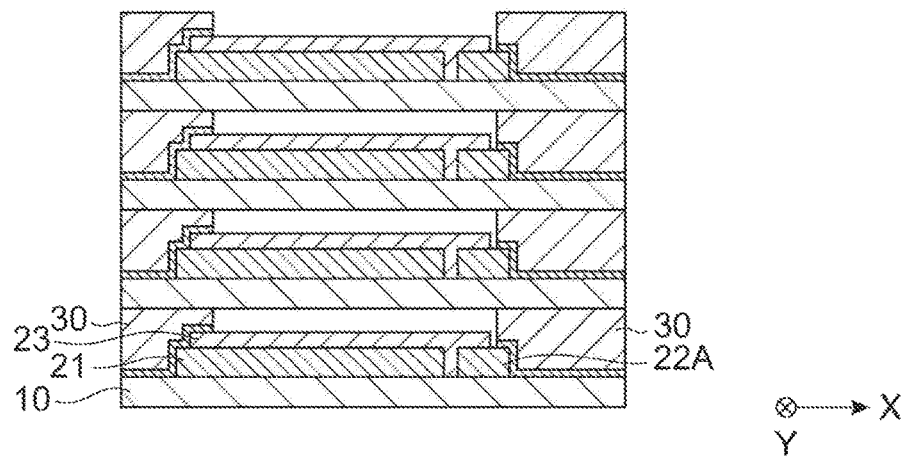
FIG. 4(A) is a diagram illustrating an intermediate product for the organic EL element after the mask forming step illustrated in FIG. 1(E) and FIG. 4(B) is a diagram (cross-sectional view) illustrating a state in which the intermediate product for the organic EL element after a second electrode forming step illustrated in FIG. 1(F) is wound into a roll shape.

According to the method of manufacturing an organic EL element of the first embodiment, when the substrate 10 is first wound on a roller after the positive electrode layer 21 and the light emitting layer 23 or the functional layer are formed (refer to a roll cross section illustrated in FIG. 4(A)), the mask element 30 having flexibility makes it possible to prevent the film surface of the light emitting layer 23 or the functional layer from coming in contact with the back surface of the substrate 10 and additionally, it is possible to prevent the film surface of the light emitting layer 23 or the functional layer from coming in direct contact with a roller. In particular, even if the width of the substrate 10 becomes larger, the grid-like mask element 30 makes it possible to prevent the occurrence of sagging, and it is possible to prevent the film surface of the light emitting layer 23 or the functional layer from coming in contact with the back surface of the substrate 10 also in the central portion in the width direction Y. As a result, it is possible to prevent a film surface of the light emitting layer 23 or the functional layer from being physically or chemically damaged (protection of the film surface).

Figure 4B:
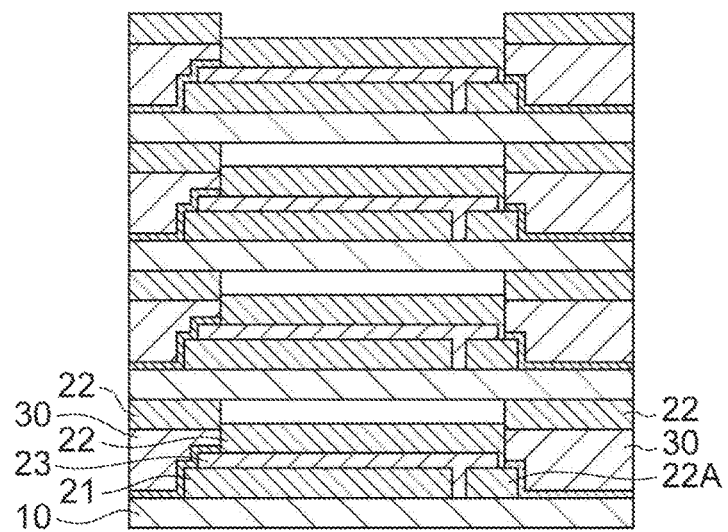

Similarly, even when the substrate 10 is first wound on a roller after the negative electrode layer 22 is formed (refer to a roll cross section illustrated in FIG. 4(B)), the mask element 30 having flexibility makes it possible to prevent the film surface of the negative electrode layer 22 from coming in contact with the back surface of the substrate 10, and additionally, it is possible to prevent the film surface of the negative electrode layer 22 from coming in direct contact with a roller. In particular, even if the width of the substrate 10 becomes larger, the grid-like mask element 30 makes it possible to prevent the occurrence of sagging, and it is possible to prevent the film surface of the negative electrode layer 22 from coming in contact with the back surface of the substrate 10 also in the central portion in the width direction Y. As a result, it is possible to prevent the film surface of the negative electrode layer 22 from being physically or chemically damaged.

In addition, according to method of manufacturing an organic EL element of the first embodiment, the mask element 30 can be used as a mask for forming the negative electrode layer 22, and it is not necessary to set a shadow mask for forming the negative electrode layer 22 as in the related art. Therefore, it is possible to improve continuous productivity (improvement in continuous productivity).

Here, since the mask element 30 covers the edge portions 21a and 23a in the positive electrode layer 21 and the light emitting layer 23 or the functional layer, when the mask element 30 is used as a mask for forming the negative electrode layer 22, it is possible to prevent the positive electrode layer 21 and the negative electrode layer 22 from coming in contact with each other and it is possible to form a connecting portion for lead-out wiring on the edge portion 21a of the positive electrode layer 21. In addition, since the mask element 30 covers the edge portion 22b in a portion of the negative electrode layer 22, it is possible to form a connecting portion for lead-out wiring on the edge portion 22b of the negative electrode layer 22.

Modified Example of First Embodiment

Figure 5A:
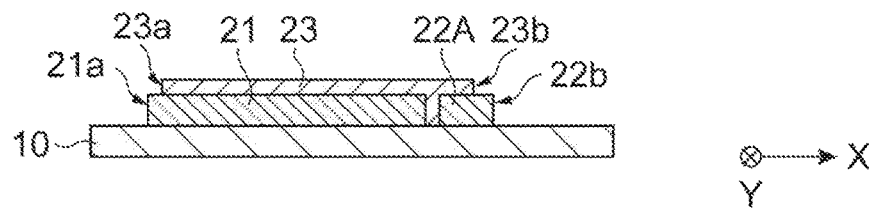
FIG. 5(A), FIG. 5(B), FIG. 5(C), FIG. 5(D), FIG. 5(E) and FIG. 5(F) are diagrams (cross-sectional views) illustrating a method of manufacturing an organic EL element (organic electronic element) according to a modified example of the first embodiment.
Figure 5B:
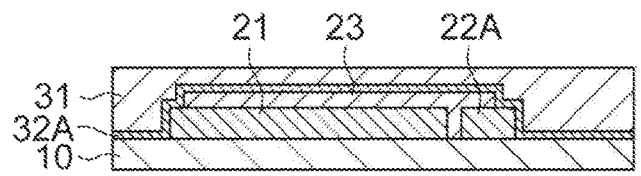
Figure 5C:
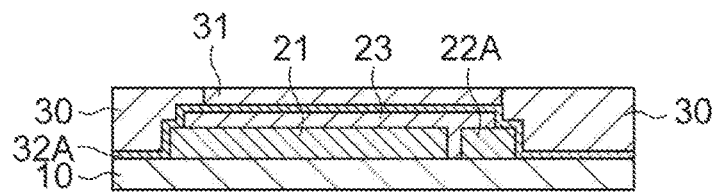
Figure 5D:
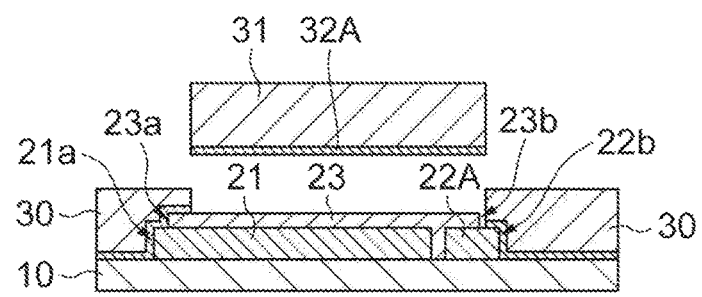
Figure 5E:
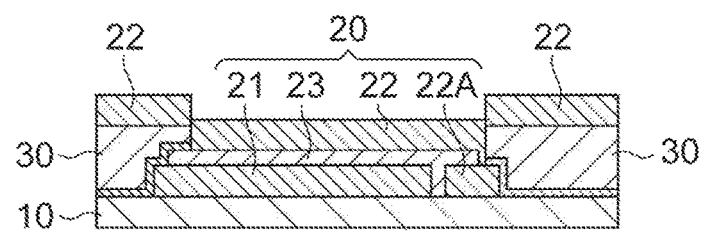
Figure 5F:
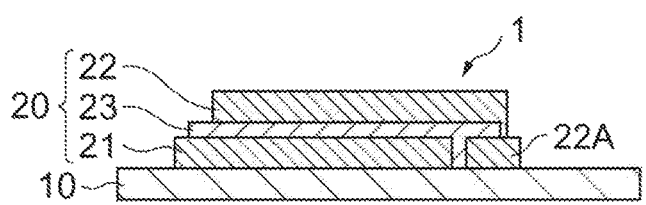

FIGS. 5(A)-5(F) are diagrams (cross-sectional view) illustrating a method of manufacturing an organic EL element (organic electronic element) according to a modified example of the first embodiment. The method of manufacturing an organic EL element of the modified example differs from the method of manufacturing an organic EL element of the first embodiment in that it includes a mask forming step illustrated in FIG. 5(B) to FIG. 5(D) in place of the mask forming step illustrated in FIG. 1(B) to FIG. 1(E) in the first embodiment. Here, the first electrode forming step and the functional layer forming step illustrated in FIG. 5(A) are the same as the first electrode forming step and the functional layer forming step illustrated in FIG. 1(A), and the second electrode forming step illustrated in FIG. 5(E) is the same as the second electrode forming step illustrated in FIG. 1(F). The mask separating step illustrated in FIG. 5(F) is the same as the mask separating step illustrated in FIG. 1(G).

The mask forming step illustrated in FIG. 5(B) to FIG. 5(D) will be described below. First, as illustrated in FIG. 5(B), the removable release sheet 32A and the mask film 31 having flexibility are sequentially laminated on the substrate 10 such that the positive electrode layer 21 and the light emitting layer 23 or the functional layer are covered.

Next, as illustrated in FIG. 5(C) and FIG. 5(D), the release sheet 32A and the mask film 31 are processed into the mask element 30. Specifically, an opening region is cut out from the release sheet 32A and the mask film 31 such that the mask element 30 covers the edge portions 21a and 23a in the positive electrode layer 21 and the light emitting layer 23 or the functional layer, and the mask element 30 surrounds the edge portion 23b in the light emitting layer 23 or the functional layer, and thus the mask element 30 is produced.

Also in the method of manufacturing an organic EL element of the modified example, it is possible to obtain the same advantages as in the method of manufacturing an organic EL element of the first embodiment.

Second Embodiment

FIGS. 6(A)-6(G) are diagrams (cross-sectional view) illustrating a method of manufacturing an organic EL element (organic electronic element) according to the second embodiment. The method of manufacturing an organic EL element of the second embodiment differs from the method of manufacturing an organic EL element of the first embodiment in that the order of the functional layer forming step and the mask forming step in the first embodiment is changed.

Figure 6A:
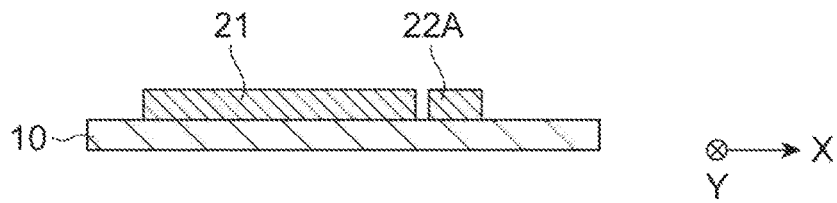
FIG. 6(A), FIG. 6(B), FIG. 6(C), FIG. 6(D), FIG. 6(E), FIG. 6(F) and FIG. 6(G) are diagrams (cross-sectional views) illustrating a method of manufacturing an organic EL element (organic electronic element) according to a second embodiment.

First, using a continuous transport method such as a roll-to-roll process, according to a vapor deposition method, a sputtering method, an ion plating method, a plating method, a transfer method or the like, as illustrated in FIG. 6(A), the positive electrode layer 21 for the organic EL portion 20 is pattern-formed on the film-like substrate 10. In addition, the lead-out electrode layer 22A to be bonded to the negative electrode layer (second electrode layer) may be pattern-formed on the film-like substrate 10 (first electrode forming step).

Next, using a roll-to-roll process, as illustrated in FIG. 6(B) to FIG. 6(E), the mask element with an opening 30 is formed on the substrate 10 to surround four sides of the positive electrode layer 21 in an opening region. In other words, the mask element with an opening 30 is a grid-like mask element that crosses the substrate 10 in the longitudinal direction X and the width direction Y. The mask element 30 is formed to cover the edge portion 21a in the positive electrode layer 21.

Figure 6B:
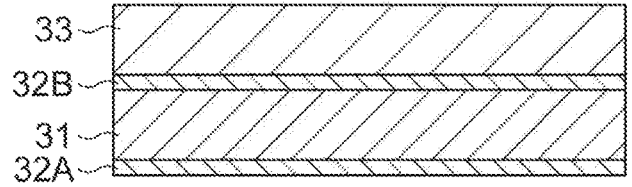
Figure 6C:
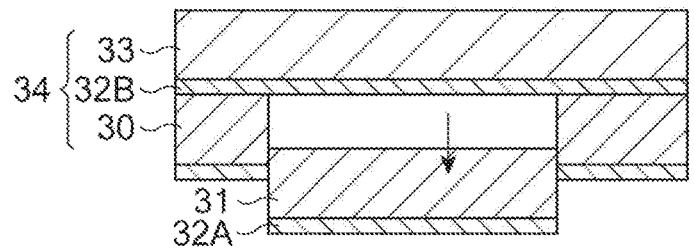

Specifically, first, as illustrated in FIG. 6(B) and FIG. 6(C), the first removable release sheet 32A, the mask film 31 having flexibility, the second removable release sheet 32B, and the carrier film 33 are laminated in that order, and the release sheet 32A and the mask film 31 are processed into the mask element 30 to produce the lamination film 34. Specifically, the opening region is cut out from the release sheet 32A and the mask film 31 and thus the mask element 30 is produced.

Figure 6D:
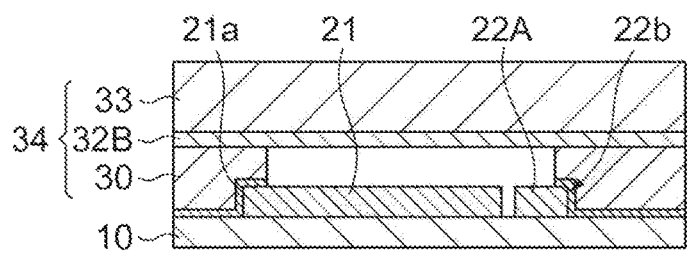

Next, as illustrated in FIG. 6(D), the lamination film 34 is laminated on the substrate 10 such that the mask element 30 covers the edge portion 21a of the positive electrode layer 21 and the mask element 30 covers the edge portion 22b of the negative electrode layer 22.

Figure 6E:
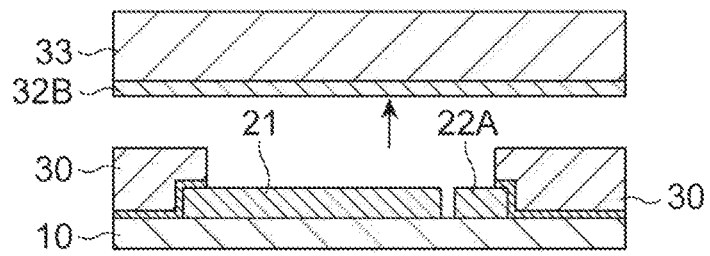

Next, as illustrated in FIG. 6(E), the removable release sheet 32B and the carrier film 33 in the lamination film 34 are separated from the mask element 30 (mask forming step).

Figure 6F:
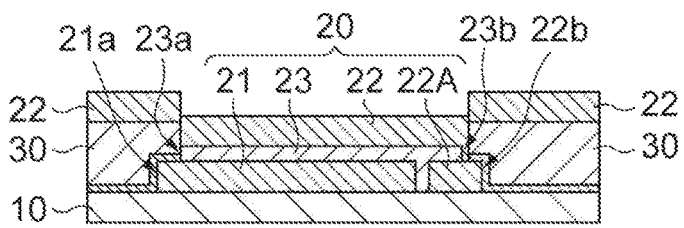

Next, using a roll-to-roll process, according to a coating method (for example, an ink jet printing method, a slit coating method, a spray method, or a screen printing method), as illustrated in FIG. 6(F), the light emitting layer 23 or the functional layer for the organic EL portion 20 is pattern-formed on the positive electrode layer 21 and the lead-out electrode layer 22A. The edge portion 23a of the light emitting layer 23 or the functional layer is formed such that it comes in contact with the mask element 30 and is formed to be shorter than the edge portion 21a such that the edge portion 21a of the positive electrode layer 21 is exposed to obtain a lead-out wiring connecting portion. On the other hand, the edge portion 23b of the light emitting layer 23 or the functional layer is formed such that it provides a space with the mask element 30 therebetween and is formed to be shorter than the edge portion 22b such that the edge portion 22b of the negative electrode layer 22 is exposed to obtain a lead-out wiring connecting portion. In addition, the edge portion 23c of the light emitting layer 23 is formed to be longer than the edge portion 21c such that the edge portion 21c of the positive electrode layer 21 is covered and the edge portion 23d of the light emitting layer 23 is formed to be longer than the edge portion 21d such that the edge portion 21d of the positive electrode layer 21 is covered (functional layer forming step).

Next, using a roll-to-roll process, according to a vapor deposition method, a sputtering method, an ion plating method, a plating method, a transfer method or the like, as illustrated in FIG. 6(F), the negative electrode layer 22 for the organic EL portion 20 is formed on the light emitting layer 23. In this case, the mask element 30 is used as a mask (second electrode forming step).

Figure 6G:
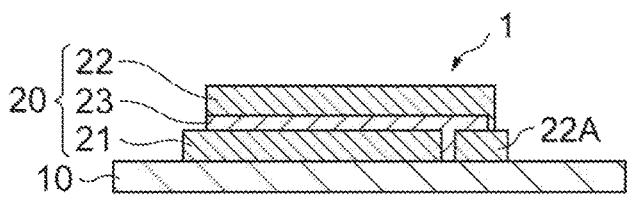

Next, using a roll-to-roll process, as illustrated in FIG. 6(G), the mask element 30 is separated from the substrate 10 (mask separating step). Here, after a sealing film is formed on the negative electrode layer 22 using the mask element 30 (sealing film forming step), the mask element 30 may be separated therefrom.

Also in the method of manufacturing an organic EL element of the second embodiment, it is possible to obtain the same advantages as in the method of manufacturing an organic EL element of the first embodiment.

Modified Example of Second Embodiment

Figure 7A:
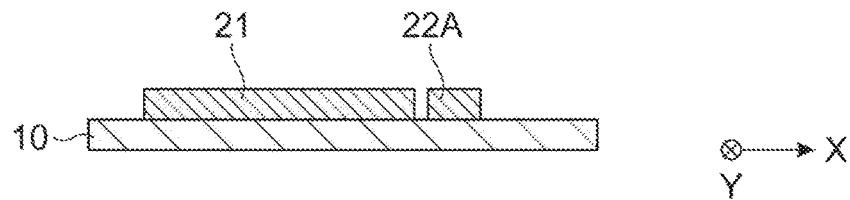
FIG. 7(A), FIG. 7(B), FIG. 7(C), FIG. 7(D), FIG. 7(E) and FIG. 7(F) are diagrams (cross-sectional views) illustrating a method of manufacturing an organic EL element (organic electronic element) according to a modified example of the second embodiment.

FIGS. 7(A)-7((F) show diagrams (cross-sectional views) illustrating a method of manufacturing an organic EL element (organic electronic element) according to a modified example of the second embodiment. The method of manufacturing an organic EL element of the modified example differs from the method of manufacturing an organic EL element of the second embodiment in that it includes a mask forming step illustrated FIG. 7(B) to FIG. 7(D) in place of the mask forming step illustrated in FIG. 6(B) to FIG. 6(E) in the second embodiment. Here, the first electrode forming step illustrated in FIG. 7(A) is the same as the first electrode forming step illustrated in FIG. 6(A), the functional layer forming step and the second electrode forming step illustrated in FIG. 7(E) are the same as the functional layer forming step and the second electrode forming step illustrated in FIG. 6(F), and the mask separating step illustrated in FIG. 7(F) is the same as the mask separating step illustrated in FIG. 6(G).

Figure 7B:
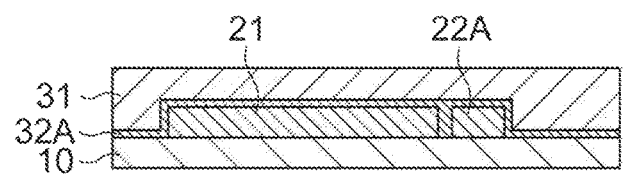

A mask forming step illustrated in FIG. 7(B) to FIG. 7(D) will be described below. First, as illustrated in FIG. 7(B), the removable release sheet 32A and the mask film 31 having flexibility are sequentially laminated on the substrate 10 such that the positive electrode layer 21 is covered.

Figure 7C:
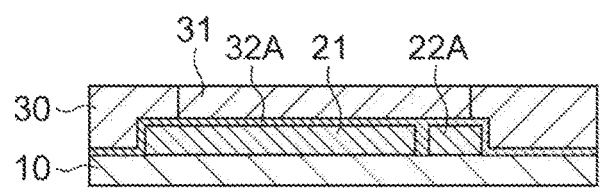
Figure 7D:
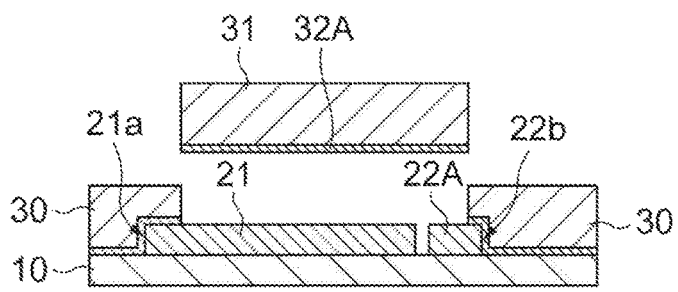
Figure 7E:
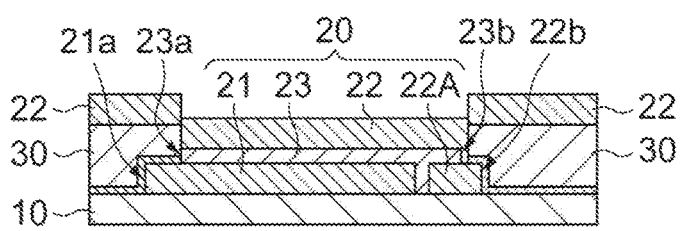
Figure 7F:
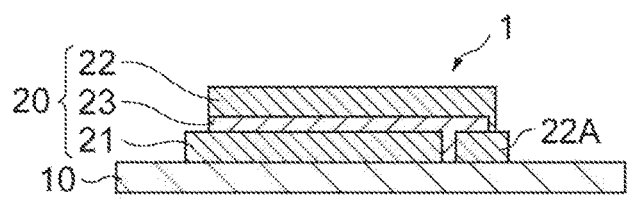

Next, as illustrated in FIG. 7(C) and FIG. 7(D), the release sheet 32A and the mask film 31 are processed into the mask element 30. Specifically, an opening region is cut out from the release sheet 32A and the mask film 31 such that the mask element 30 covers the edge portion 21a of the positive electrode layer 21, the mask element 30 covers the edge portion 22b of the negative electrode layer 22, and the mask element 30 surrounds the edge portions 21c and 21d of the positive electrode layer 21, and thus the mask element 30 is produced.

Also in the method of manufacturing an organic EL element of the modified example, it is possible to obtain the same advantages as in the method of manufacturing an organic EL element of the first and second embodiments.

Here, the present invention is not limited to the above embodiments and various modifications can be made. For example, while an organic EL element including a light emitting layer (functional layer) between a pair of electrodes has been exemplified in the present embodiment, features of the present invention can also be applied to various organic EL elements illustrated below.
a) Positive electrode/light emitting layer/negative electrode
b) Positive electrode/hole injection layer/light emitting layer/negative electrode
c) Positive electrode/hole injection layer/light emitting layer/electron injection layer/negative electrode
d) Positive electrode/hole injection layer/light emitting layer/electron transport layer/electron injection layer/negative electrode
e) Positive electrode/hole injection layer/hole transport layer/light emitting layer/negative electrode
f) Positive electrode/hole injection layer/hole transport layer/light emitting layer/electron injection layer/negative electrode
g) Positive electrode/hole injection layer/hole transport layer/light emitting layer/electron transport layer/electron injection layer/negative electrode
h) Positive electrode/light emitting layer/electron injection layer/negative electrode
i) Positive electrode/light emitting layer/electron transport layer/electron injection layer/negative electrode Here, the symbol "/" indicates that layers between which the symbol "/" is interposed are laminated adjacent to each other.

Here, the method of manufacturing an organic EL element in the form in which a positive electrode layer is disposed on the side of the substrate with respect to the light emitting layer and a negative electrode layer is disposed on the side opposite to the substrate with respect to the light emitting layer has been exemplified in the present embodiment. However, the present invention can also be applied to a manufacturing method in the form in which the negative electrode layer is disposed on the side of the substrate with respect to the light emitting layer and the positive electrode layer is disposed on the side opposite to the substrate with respect to the light emitting layer.

In addition, while the method of manufacturing an organic EL element (organic electronic element) has been exemplified in the present embodiment, the features of the present invention can also be applied to a method of manufacturing an organic solar cell (organic electronic element) and an organic transistor (organic electronic element).

REFERENCE SIGNS LIST

1 Organic EL element (organic electronic element)
10 Substrate (elongated substrate)
20 Organic EL portion
21 Positive electrode layer (first electrode)
21a, 21c, 21d Edge portion on each side of positive electrode layer
22 Negative electrode layer (second electrode)
22b Edge portion on each side of negative electrode layer
22A Lead-out electrode layer
23 Light emitting layer (functional layer)
23a, 23b, 23c, 23d Edge portion on each side of light emitting layer 30 Mask element
31 Mask film
32A, 32B First and second release sheets
33 Carrier film
34 Lamination film
X Longitudinal direction of elongated substrate
Y Width direction of elongated substrate

The invention claimed is:

1. A method of manufacturing an organic electronic element having flexibility using a roll-to-roll process, the method comprising:
   a first electrode forming step in which a first electrode is pattern-formed onto a flexible substrate;
   a functional layer forming step in which a functional layer containing an organic material is pattern-formed onto the first electrode; and
   a mask forming step in which a mask element having flexibility is formed on the substrate such that it has an opening on at least a portion of the functional layer and at least a portion of the first electrode with the functional layer therebetween and covers an edge portion on at least one side of the first electrode and an edge portion on at least one side of the functional layer,
   wherein the mask forming step includes
      a step in which a lamination film in which a first removable release sheet, a mask film having flexibility, a second removable release sheet, and a carrier film are laminated in that order, and the first removable release sheet and the make film are processed into the mask element having the opening is produced;
      a step in which the lamination film is laminated on the substrate such that the mask element covers an edge portion on at least one side of the first electrode and an edge portion on at least one side of the functional layer; and
      a step in which the second removable release sheet and the carrier film in the lamination film are separated from the mask element.

2. The organic electronic element manufacturing method according to claim 1, further comprising
   a second electrode forming step in which a second electrode is formed on the functional layer using the mask element.

3. A method of manufacturing an organic electronic element having flexibility using a roll-to-roll process, the method comprising:
   a first electrode forming step in which a first electrode is pattern-formed onto a flexible substrate; and
   a mask forming step in which a mask element having flexibility is formed on the substrate such that it has an opening on at least a portion of the first electrode and covers an edge portion on at least one side of the first electrode,
   wherein the mask forming step includes
      a step in which a lamination film in which a first removable release sheet, a mask film having flexibility, a second removable release sheet, and a carrier film are laminated in that order, and the first removable release sheet and the mask film are processed into the mask element having the opening is produced;
      a step in which the lamination film is laminated on the substrate such that the mask element covers an edge portion on at least one side of the first electrode; and
   a step in which the second removable release sheet and the carrier film in the lamination film are sepoarated from the mask element.

4. The organic electronic element manufacturing method according to claim 3, further comprising
   a functional layer forming step in which a functional layer containing an organic material is pattern-formed onto the first electrode after the mask forming step; and
   a second electrode forming step in which a second electrode is formed on the functional layer using the mask element.

5. The organic electronic element manufacturing method according to claim 2, further comprising
   a sealing film forming step in which a sealing film is formed on the second electrode using the mask element.

6. The organic electronic element manufacturing method according to claim 2, further comprising
   a mask separating step in which the mask element is separated from the substrate.

* * * * *